(12) United States Patent
Kopf

(10) Patent No.: US 9,124,064 B2
(45) Date of Patent: Sep. 1, 2015

(54) ULTRASHORT PULSE MICROCHIP LASER, SEMICONDUCTOR LASER, AND PUMP METHOD FOR THIN LASER MEDIA

(76) Inventor: Daniel Kopf, Roethis (AT)

( * ) Notice: Subject to any disclaimer, the term of this patent is extended or adjusted under 35 U.S.C. 154(b) by 0 days.

(21) Appl. No.: 13/698,733

(22) PCT Filed: May 24, 2011

(86) PCT No.: PCT/EP2011/058401
§ 371 (c)(1),
(2), (4) Date: Nov. 19, 2012

(87) PCT Pub. No.: WO2011/147799
PCT Pub. Date: Dec. 1, 2011

(65) Prior Publication Data
US 2013/0064262 A1    Mar. 14, 2013

(30) Foreign Application Priority Data

May 28, 2010  (EP) ..................... 10164247

(51) Int. Cl.
*H01S 3/06* (2006.01)
*H01S 5/04* (2006.01)
(Continued)

(52) U.S. Cl.
CPC ............ *H01S 3/0627* (2013.01); *H01S 3/0612* (2013.01); *H01S 3/094084* (2013.01); *H01S 5/041* (2013.01); *H01S 5/183* (2013.01); *H01S 3/0604* (2013.01); *H01S 3/094038* (2013.01); *H01S 3/1022* (2013.01); *H01S 3/113* (2013.01); *H01S 3/1611* (2013.01); *H01S 3/1671* (2013.01); *H01S 5/0657* (2013.01);
(Continued)

(58) Field of Classification Search
CPC ............... H01S 3/0612; H01S 3/0627; H01S 3/094084; H01S 5/041; H01S 5/183
USPC ......................... 372/18, 25, 45.013
See application file for complete search history.

(56) References Cited

U.S. PATENT DOCUMENTS 5,343,485 A   8/1994 Okazaki
5,495,494 A   2/1996 Molva et al.
(Continued)

FOREIGN PATENT DOCUMENTS

DE       102 60 183 A1     7/2004

OTHER PUBLICATIONS

Nodop et al., "High-pulse-energy passively Q-switched quasi-monolithic microchip lasers operating in the sub-100-ps pulse regime", Optics Letters, vol. 32, Issue 15, 1. Aug. 2007, pp. 2115-2117.
(Continued)

*Primary Examiner* — Armando Rodriguez
(74) *Attorney, Agent, or Firm* — Maschoff Brennan

(57) ABSTRACT

The invention relates to an optically pumped ultrashort pulse microchip laser for generating a laser emission having femto- or picosecond pulses, comprising a substrate, an amplifying laser medium, a first resonator mirror that is at least partially transparent to optical pump radiation, and in particular a saturable absorber structure. The laser medium is applied to the resonator mirror and the substrate and subsequently reduced from the original material thickness to a thickness of less than 200 μm. In order to achieve satisfactory power absorption despite said low thickness, the optical pump radiation is coupled into the laser medium such that resonance occurs for the laser emission and excess intensity increases occur for the pump radiation.

28 Claims, 8 Drawing Sheets

(51) Int. Cl.
*H01S 5/183* (2006.01)
*H01S 3/094* (2006.01)
*H01S 3/102* (2006.01)
*H01S 3/113* (2006.01)
*H01S 3/16* (2006.01)
*H01S 5/065* (2006.01)
*H01S 5/20* (2006.01)

(52) U.S. Cl.
CPC ........ *H01S 5/18316* (2013.01); *H01S 5/18319* (2013.01); *H01S 5/18358* (2013.01); *H01S 5/2027* (2013.01)

(56) References Cited

U.S. PATENT DOCUMENTS

| | | | |
|---|---|---|---|
| 7,522,646 | B2 | 4/2009 | Brick et al. |
| 7,811,501 | B2 * | 10/2010 | Nishida et al. ............ 264/337 |
| 8,477,410 | B2 * | 7/2013 | Hodgson et al. ............ 359/330 |
| 2004/0233961 | A1 * | 11/2004 | Lutgen ............ 372/70 |
| 2005/0094689 | A1 | 5/2005 | Ludewigt |
| 2005/0207457 | A1 * | 9/2005 | Agnesi et al. ............ 372/27 |
| 2006/0193358 | A1 * | 8/2006 | Alfano et al. ............ 372/41 |
| 2007/0189350 | A1 | 8/2007 | Young et al. |
| 2008/0247425 | A1 * | 10/2008 | Welford ............ 372/10 |

OTHER PUBLICATIONS

Pallmann et al., "Novel ultrafast vertically emitting semiconductor lasers", 36th European Conference and Exhibition on Optical Communication (ECOC), pp. 1-3, Sep. 2010.

Spueler et al. "Experimentally confirmed design guidelines for passively Q switched microchip lasers using semiconductor saturable absorbers", Journal of Optical Society of America (JOSA) B, vol. 16, No. 3, pp. 376-388, Mar. 1999.

Braun et al. "56-ps passively Q-switched diode-pumped microchip laser", Optics Letters, vol. 22, No. 6, pp. 381-383, Mar. 1997.

Zayhowski et al., "Short-pulsed Nd:YAG/Cr4+:YAG passively Q-switched microchip lasers", Lasers and Electro-Optics Conference, pp. 1437-1438, Jun. 2003.

* cited by examiner

| Layer | | Ratio x/y | Thickness [nm] | |
|---|---|---|---|---|
| | GaAs | | 75.0 | B |
| | GaAs | | 10.0 | |
| SC | GaAs$_y$P$_{1-y}$ | 0.75 | 7.5 | |
| | GaAs | | 53.5 | |
| QW | In$_x$Ga$_{1-x}$As | ≈ 0.23 | 7.0 | |
| | GaAs | | 63.5 | |
| SC | GaAs$_y$P$_{1-y}$ | 0.75 | 15.0 | |
| | GaAs | | 63.5 | |
| QW | In$_x$Ga$_{1-x}$As | ≈ 0.23 | 7.0 | 9x |
| | GaAs | | 63.5 | |
| SC | GaAs$_y$P$_{1-y}$ | 0.75 | 7.5 | |
| DBR | GaAs | | 75.0 | |
| DBR | AlAs | | 89.2 | 25x |
| | GaAs | | | |

ULTRASHORT PULSE MICROCHIP LASER, SEMICONDUCTOR LASER, AND PUMP METHOD FOR THIN LASER MEDIA

FIELD OF THE INVENTION

The invention relates to an ultrashort pulse microchip laser for generating femto- or picosecond pulses, to a semiconductor laser, to a laser system comprising such an ultrashort pulse microchip laser or semiconductor laser, and to a pump method for laser media having a thickness of less than 200 µm.

BACKGROUND

Ultrashort pulse laser systems, that is to say laser arrangements which are capable of generating laser pulses having a characteristic pulse duration in the femto- or picosecond range, have been known for a long time in various embodiments from the prior art. Besides complex arrangements having long resonators, microchip lasers are also used in this case.

So-called Q-switched microchip lasers, which emit a pulse length of a few tens of picoseconds in the near infrared, are already known in their basic structure from Spühler G. J. et al. "Experimentally confirmed design guidelines for passively Q switched microchip lasers using semiconductor saturable absorbers", JOSA B, Vol. 16, No. 3, March 1999. These lasers have the advantage of particular compactness compared with mode-coupled lasers, since the laser resonator itself occupies a volume of only a few cubic millimeters or even less, while even very compact mode-coupled resonators have an edge length which is some centimeters long owing to the required resonator length. A further advantage is that laser pulses can be generated with a lower pulse repetition rate but a higher pulse energy than in the case of commercially available low-power mode-coupled oscillators.

Braun B. et al. "56-ps passively Q-switched diode-pumped microchip laser", Optics Letters, Vol. 22, No. 6, March 1997, for example, publishes an arrangement which consists of a 200 µm thin laser medium consisting of Nd:vanadate, which is bounded on one side by a laser mirror and on the other side by a saturable absorber mirror, or SESAM (Semiconductor Saturable Absorber Mirror). The published pulse energy is a few tens of nJ. The laser medium is in this case made as a single piece and then positioned between the two end elements, output coupler and SESAM, without bonding being carried out.

It is known from Zayhowski J. J. and Wilson A. L. "Short-pulsed Nd:YAG/Cr$^{4+}$:YAG passively Q-switched microchip lasers", OSA/CLEO 2003, that pulse lengths of around 150 ps can be achieved with a sandwich arrangement of Nd:YAG and passive Cr$^{4+}$:YAG Q-switching. With a high degree of compactness, this arrangement achieves pulse energies extending into the µJ range, but with pulse lengths which are in excess of 100 ps since the passive Q-switching, i.e. the material Cr$^{4-}$:YAG, necessitate a certain length so that optimization toward shorter pulse lengths is not possible. These lasers are therefore not suitable for applications in which it is necessary to provide ultrashort pulses.

Nodop D. et al. "High-pulse-energy passively Q-switched-quasi-monolithic microchip lasers operating in the sub-100-ps pulse regime", Optics Letters, Vol. 32, No. 15, August 2007, likewise proposes an arrangement based on SESAM technology, in which a 200 µm thick laser crystal is applied by a spin-on-glass adhesive bonding technique onto the highly thermally conductive SESAM component. A dichroic output coupler, which transmits the pump light and partially couples out the laser light, is then in turn applied on the crystal by coating. This arrangement is not suitable for crystals configured even more thinly in order to achieve even shorter pulses.

Therefore, although picosecond microchip lasers are known from the prior art, they can however only achieve a minimum pulse length of a few tens of picoseconds, the minimum pulse length published being 37 ps. Even such short pulse lengths, however, are still too long for some applications.

In order to be able to generate shorter pulse lengths, the laser medium would have to be configured even more thinly, but this is problematic in terms of manufacturing technology since the production and handling of laser media as components having a thickness of 100 µm or less entails difficulties.

The problem furthermore arises of the different thermal expansion coefficients, which are necessarily encountered in such a miniature resonator owing to the use of different materials and which can lead to thermally induced fracture in the material or disbonding at a boundary layer. Furthermore, the achievable thermal lens, which is necessary for suitable mode formation, is no longer sufficient because of the longitudinally increasing thermal profile and dissipation. Another problem is the fact that the energy densities in a SESAM become too great and optical destruction can result, so that corresponding long-term operation is therefore not possible in solutions of the prior art. Furthermore, an increasingly thin laser medium entails the problem that the gain also decreases. Lastly, there is a further problem because, in the case of very thin laser media, the oscillation antinodes of the pump radiation—when it is reflected back on itself at a surface or interface opposite an entry face—deviates owing to the different wavelengths from the oscillation antinodes of the laser radiation, so that an optimal overlap cannot be ensured or the overlapping even diverges.

SUMMARY

It is an object of the present invention to improve ultrashort pulse microchip lasers or vertically emitting semiconductor lasers in respect of the temporal characteristic of the laser emission generated.

It is another object to provide microchip lasers, vertically emitting semiconductor lasers and corresponding laser systems for generating femto- or picosecond pulses with pulse durations of less than 30 ps, in particular less than 1 ps.

It is another object to provide a pump method for very thin laser media.

The invention relates to the generation of ultrashort laser pulses by using microchip lasers which have an optically pumped laser medium. This laser medium is contained in a laser resonator which is very short according to the generic type, and which is defined by reflective interfaces of the laser medium or by corresponding separate components. These elements may be bonded together directly and without gaps, or they may have a certain separation. In order to bond separate elements or form them as functional components on a carrier material, various methods are available in the prior art, for example diffusion bonding, ion beam sputtering or optical adhesive bonding processes.

According to the invention, a laser medium required in order to generate laser pulses having a temporal characteristic of less than 30 ps, in particular less than 10 or less than 1 ps, or a corresponding resonator, is not formed by assembling separate components but rather a substrate and the laser medium are bonded together, in which case the laser medium may have a comparatively large material thickness of for example more than 200 μm. After bonding of these elements, between which further layers may also be arranged, reduction of the original material thickness of the laser medium is carried out, for example by grinding or polishing down, to the thickness necessary for the short pulse durations.

In order to avoid thermal effects and stresses, the substrate and the laser medium are preferably made of the same material, in which case the properties may be adapted by expedient selection of the doping.

Owing to the very thin laser medium, and therefore also the very short laser resonator, adaptation of the pump method is advantageous for achieving satisfactory performance parameters.

According to the invention, the input of the pump light takes place at an angle, dependent on the wavelength of the pump radiation, with respect to the emission direction of the laser radiation, or the extent of the laser medium, so that the amplification is optimized by the spatial adaptation of the intensity patterns of laser emission and pump radiation. The wavelength and incidence angle of the pump radiation are in this case selected in such a way that the pump radiation isophotes, i.e. the lines or points of equal brightness, correspond to an intensity pattern of the laser emission.

To this end, adaptation of the mirror characteristics is advantageously carried out so that a part of the pump light coupled in is reflected in the resonator. A further refinement consists in the integration of mirror functionality and laser medium in a layer structure, so that a distribution of the laser medium corresponding to the intensity pattern is possible. Adaptation and tuning of pump-radiation and emission characteristics with the spatial distribution of the laser medium is therefore carried out. In this particular exemplary embodiment, the latter is not placed in its entirety as an isolated block, but arranged distributed over the entire layer structure.

In general, the pump method according to the invention may be employed for optically pumped semiconductor lasers (OPSLs) having a saturable absorber, in particular for vertically emitting semiconductor lasers (VCSELs). These are arrangements in which the pump light is introduced according to the invention into the laser structure and reflected therein at a surface or layer structure. According to the invention, the (internal, i.e. measured in the material) incidence angle has a value which leads to an overlap of the pump and laser isophotes. With a smaller incidence angle (for example zero), however, the overlap is not optimal.

The reflection of the pump light makes it possible to utilize the residual light which would otherwise not be available. Furthermore, in the case of using a saturable absorber, saturation by the pump light is avoided.

BRIEF DESCRIPTION OF THE DRAWINGS

The ultrashort pulse microchip laser, or vertically emitting semiconductor laser, according to the invention, and the pump method according to the invention for laser media having a thickness of less than 200 μm, will be described or explained in more detail below purely by way of example with the aid of exemplary embodiments schematically represented in the drawing. In detail.

DETAILED DESCRIPTION

Figures 1, 2:
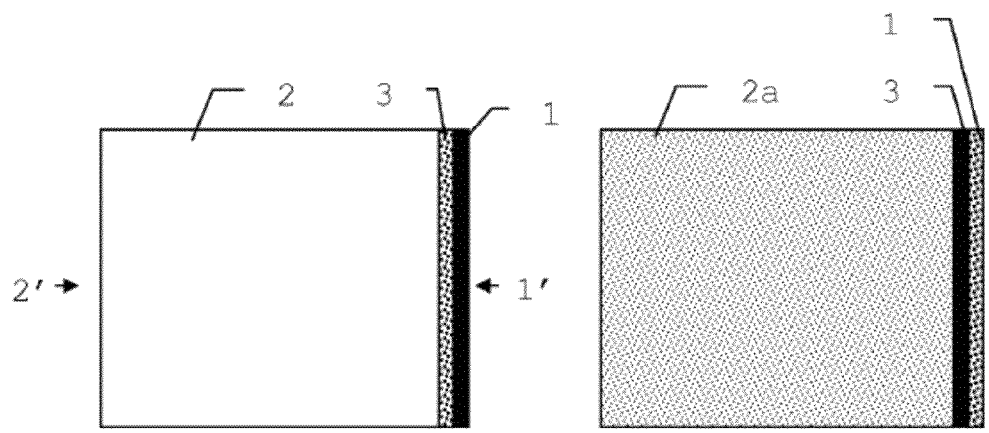
FIG. 1 shows the schematic representation of a first exemplary embodiment of the ultrashort pulse microchip laser according to the invention.
FIG. 2 shows the schematic representation of a second exemplary embodiment of the ultrashort pulse microchip laser according to the invention.

FIG. 1 shows the schematic representation of a first exemplary embodiment of the ultrashort pulse microchip laser according to the invention. In order to produce such an optically pumped ultrashort pulse microchip laser, the laser medium 1 is applied on a substrate 2, in which case the latter may for example consist of vanadate and in this first exemplary embodiment is undoped. Before the bonding of these two elements, a dichroic output coupler layer or a dichroic output coupling mirror as a first resonator mirror 3 is applied onto the substrate 2, to which end various methods are available, for example ion beam sputtering. For Nd:vanadate as the laser medium 1, the dichroic mirror 3 in this example will be one with a reflectivity of 95% for the 1064 nm wavelength of the laser emission to be generated and a transmissivity of more than 95% for a pump wavelength of 808 nm, laser diodes being used as pump sources. This first resonator mirror 3 is therefore a dichroic output coupling mirror arranged between the substrate 2 and the laser medium 1, which dichroic mirror is configured to be at least partially transmissive or partially reflective for the laser emission and for the pump radiation.

A thick polished piece of Nd:vanadate, i.e. one whose material thickness has not yet been reduced, is applied onto the substrate 2 and the dichroic mirror 3 as the laser medium 1, for example doped with more than 1% Nd, and in particular 3% Nd. The original material thickness of this component may be selected so that mechanical handling and bonding to the substrate 2, or the dichroic output coupling mirror 3, is readily possible, for example with optical contacting or diffusion bonding being envisionable as the bonding method.

After the application, the original material thickness of the laser medium 1 is reduced, for example by grinding and/or polishing down, until the remaining piece of Nd:vanadate has the desired thickness of less than 200 μm or 100 μm, for example now being only 50 μm thick. Owing to the laser medium 1 and its thickness in the direction of the laser emission, the structure is suitable for generating laser emission with femto- or picosecond pulses, in particular with pulse durations of less than 30 ps, particularly less than 10 ps or even less than 1 ps, in which case a component (not represented in this figure) may be used for generating laser emission (LE) with a femto- or picosecond pulse characteristic, for example by Q-switching, as may for example be carried out by using a saturable absorber structure.

A firmly connected and inherently stable arrangement is therefore produced for a very thin laser medium, the thin laser medium being applied on a thicker carrier material which consists of the same material type as the laser medium, there being a reflective optical layer structure between them. Compared with conventional structures and pump methods, the arrangement achieves an increased efficiency.

The laser medium's surface 1' facing away from the substrate is preferably uncoated or provided with an antireflection layer. Depending on the embodiment, this surface 1' may also contact the saturable absorber structure directly. The opposite surface 2' of the substrate 2, as an entry face for the pump radiation and exit face for the laser emission, may in particular be provided with an antireflection coating for these two wavelengths used.

Next to the surface 1', according to the invention, a dichroic mirror may likewise be arranged between the laser medium 1 and the saturable absorber structure as a second resonator mirror, which dichroic mirror is configured to be at least partially transmissive for the laser emission and highly reflective for the pump radiation so that essentially only the laser emission is delivered to the saturable absorber structure and contributes to the saturation process there.

If a saturable mirror structure, or a SESAM, is used as the saturable absorber structure, then it may be arranged directly next to the surface 1' as the second resonator mirror, for example bonded or mechanically positioned by means of a holding device at a small and exactly defined distance of for example only a few μm. This SESAM preferably has a dichroic coating, which is highly reflective for the pump wavelength of 808 nm and has a reflectivity unchanged from the uncoated state for the laser wavelength of 1064 nm, for example 30%. In the case of separated positioning, the intermediate space may be filled with a gas, for example air, vacuum or a filler gas, and have a defined thickness so that the laser resonator is optimized, i.e. has its resonance at the same wavelength as that at which the amplification of the laser medium as a spectral laser condition is maximal.

FIG. 2 schematically represents a second exemplary embodiment of the ultrashort pulse microchip laser according to the invention, which differs in that a doped substrate 2a, i.e. an Nd:vanadate substrate, is used instead of the undoped vanadate substrate, although in this exemplary embodiment the substrate 2a, i.e. the substrate material, is doped less heavily than the laser medium 1, or the amplifying material used for the laser medium. The doping is selected in such a way that enough pump light still arrives at the 50 μm thick laser medium 1 consisting of Nd:vanadate, for example with 0.27% Nd doping for a thickness of 3 mm.

This second exemplary embodiment has the advantages over the first that the output signal from the laser resonator passes through doped and pumped Nd:vanadate and is therefore amplified once more, and the thermal lens is formed more strongly owing to the temperature profile which is more strongly transverse—and less longitudinal—and the greater absorbed power, so that better mode formation can take place.

Figure 3:
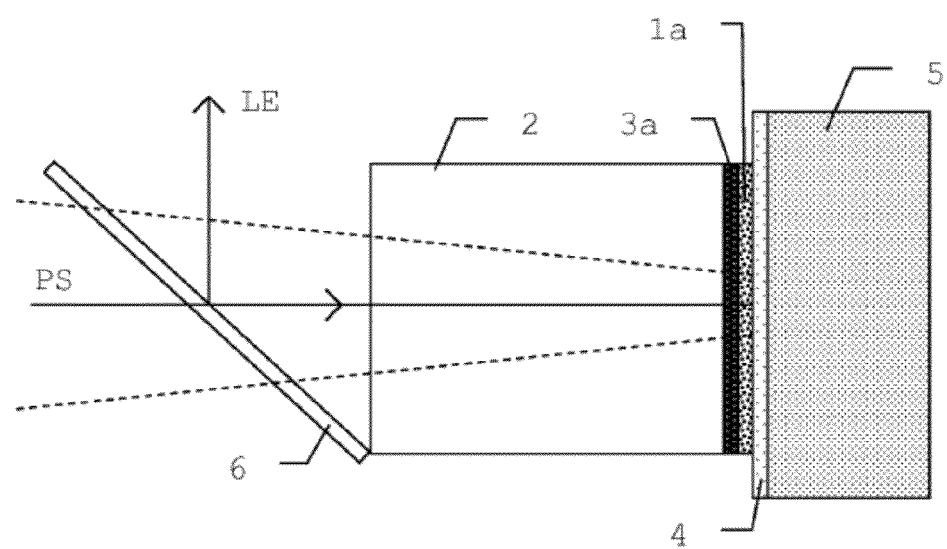
FIG. 3 shows the schematic representation of the arrangement of a third exemplary embodiment in a laser system according to the invention.

FIG. 3 shows the arrangement of a third exemplary embodiment of the ultrashort pulse microchip laser according to the invention in a laser system according to the invention.

Here, by means of a dichroic beam splitter 6, pump light or pump radiation PS is coupled into the substrate 2 and the laser emission LE generated is coupled out. On the opposite side, the laser medium 1 contacts a second resonator mirror 4, which is reflective for the pump wavelength and transmissive for the wavelength of the laser emission LE and is applied on a saturable absorber structure 5. As described in FIG. 2, this second resonator mirror may be produced by using a dichroic coating which is highly reflective for the pump wavelength of 808 nm and has a reflectivity unchanged from the uncoated state for the laser wavelength of 1064 nm, for example 30%. Instead of the second resonator mirror 4, however, reflection may also be achieved by means of a reflective interface of the laser medium 1 or by total internal reflection in the laser medium 1.

In this exemplary embodiment, the dichroic output coupling mirror as a first resonator mirror 3a is configured to be partially reflective for the optical pump radiation and, together with a second resonator mirror 4, is formed and arranged in such a way that resonance takes place for the laser emission and intensity multiplication takes place for the pump radiation.

With the setting up of pump resonance to increase the absorption and the efficiency, the third alternative embodiment is therefore comparable to the first, although the two resonator mirrors 3a and 4 are formed in such a way that laser resonance at the laser wavelength of 1064 nm and an intensity multiplication, or resonance, at the wavelength of for example 808 nm used for the pump radiation PS prevail simultaneously. This is achieved in that the output coupler coating, or the dichroic output coupling mirror 3a, is no longer highly transmissive for the pump wavelength but partially reflective, depending on the resonance or intensity magnification required for the pump inside the resonator. The resonances may in this case be adjusted exactly by selection of the phase of the coatings so that double resonance is achieved at the two wavelengths, in which case a phase shift of zero is in particular to be adjusted between pump radiation isophotes and laser emission at the first resonator mirror 3a, i.e. the dichroic output coupling mirror. It should be noted here that Nd:vanadate has different refractive indices at 808 nm and 1064 nm, which is likewise to be taken into account.

The advantage of this arrangement is that a higher power introduction, or absorption, into the laser medium 1 can be achieved even with a very small thickness. Without this optimization, the achievable amplification and power would simultaneously be reduced greatly with a decreasing thickness. Furthermore, the possibility is also provided of pumping more efficiently with a pump wavelength which exhibits lower absorption than the standard pump wavelength of 808 nm, i.e. for example at 880 nm or 888 nm. Lastly, the advantage is also obtained that even thinner resonator thicknesses or lengths of much less than 50 μm are made possible by means of this.

Figure 4:
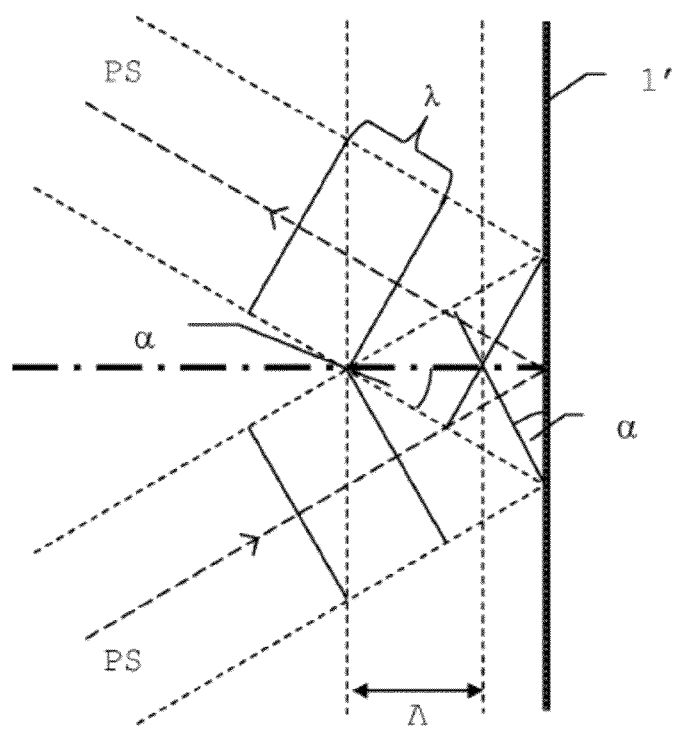
FIG. 4 shows the schematic representation of the basic principle of the pump method according to the invention.

FIG. 4 explains the basic principle of the pump method according to the invention in a schematic representation. In order still to achieve sufficient power absorption with a decreasing thickness of the laser medium, it is advantageous to couple the pump radiation PS into the substrate, or the laser medium, at an angle $\alpha$ in such a way that the overlap of pump radiation PS and laser emission is optimized.

When this pump method is employed, the rest of the resonator arrangement may in turn be a microchip arrangement or an ultrashort pulse microchip laser according to the invention. The use of the pump method is not, however, restricted to these examples and, for example, use for extended resonator arrangements or for other arrangements having very thin laser media is also possible. In this regard, this method is to be understood primarily as a pump arrangement for very thin laser media and without necessary restriction to ultrashort pulse microchip lasers according to the invention. This pump method is, however, particularly suitable for laser media having a thickness of less than 200 μm for generating a laser emission with femto- or picosecond pulses, as are implemented in the ultrashort pulse microchip laser according to the invention.

According to the invention, the optical pump radiation PS is coupled into the laser medium, at an angle α in such a way that resonance occurs for the laser emission and intensity magnification occurs for the pump radiation PS, the wavelength and incidence angle α of the pump radiation PS being selected or tuned in such a way that the pump radiation isophotes, as lines or points of equal brightness, spatially correspond to an intensity pattern of the laser emission to be generated or amplified by the laser medium. On the surface 1' forming the rear side of this thin laser medium, the not yet absorbed pump radiation PS is returned by means of a reflective interface, by means of a reflective coating system or by means of total internal reflection (TIR) and generates a standing interference pattern with the incident beam of the pump radiation PS. With suitable selection of the pump wavelength and the incidence angle α, the isophotes, or antinodes, of the pump laser radiation, for example at wavelengths of 808 or 880 nm, correspond to the intensity pattern of the laser radiation to be emitted and overlap optimally.

FIG. 4 illustrates the formation of the interference pattern, which exists in the form of isophotes, i.e. maximally pumped planes at constant distances from the reflective surface. The formula for the distance between the interference fringes, or planes, is given by $$\Lambda = \frac{\lambda}{2\cos\alpha}$$

where λ represents the wavelength of the pump radiation PS and α is its incidence angle. With a pump wavelength of λ=880 nm and an incidence angle of α=34°, this value is calculated as about 530 nm; it should be noted that the optical thickness divided by the refractive index n gives the physical distance, and therefore corresponds well to the spacing of two oscillation antinodes of the laser radiation to be emitted with a wavelength of 1064 nm (with ½·1064 nm=532 nm). With a pump wavelength of λ=808 nm and an incidence angle of α=40°, an isophote spacing is likewise calculated as about 530 nm (optical thickness), which therefore likewise corresponds well to the spacing of two oscillation antinodes of the laser radiation (with ½·1064 nm=532 nm optical length). This relation corresponds to a phase shift of zero between pump radiation isophotes and laser emission at a first resonator mirror which is at least partially transmissive for the pump radiation PS.

In the simplest case, α=0°, which corresponds to normal incidence of the pump radiation PS. The incident and returned pump radiation PS then give an interference pattern, or a standing wave, with the (optical) period Λ=λ/2. This in each case differs from the radiation distribution of the laser radiation to be emitted owing to the wavelength difference, so that optimally excited regions in the laser medium do not coincide everywhere with the radiation field of the laser radiation to be emitted. Therefore, not all excited ions can optimally impart their energy to the laser radiation to be emitted.

By optimal selection of an angle of the incident pump radiation and the phase between the radiation fields formed in the laser medium, of the pump radiation PS on the one hand and of the laser radiation to be emitted on the other hand, an optimized overlap of these two radiation fields is achieved. The achieved amplification and the pump yield are thereby increased. This improved overlap furthermore ensures that parasitic lasing with undesired transverse or longitudinal modes is suppressed, which may otherwise readily result owing to unused inversion and therefore existing amplification.

Figure 5:
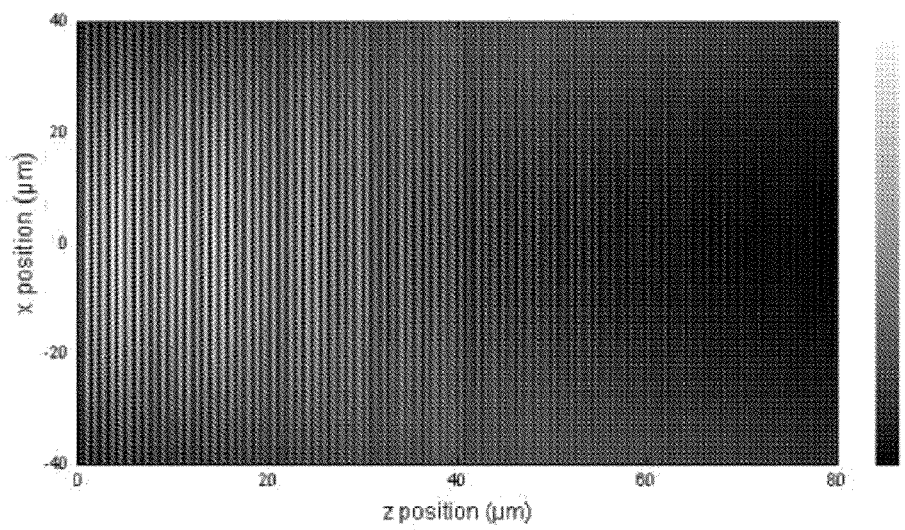
FIG. 5 shows the representation of a calculated example of a pump intensity pattern for the pump method according to the invention.

FIG. 5 shows a calculated example of a pump intensity pattern for the parameters α=40.6°, Λ=808 nm, n=2.16. The refractive index is in this case assumed to be constant for both wavelengths for reasons of simplified calculation. In reality, the departure from the actual situation due to the simplifying assumption can be taken into account by fine tuning of the angle. The isophote spacing resulting from the calculation is then 532 nm (optical thickness) and can therefore be kept in phase over a few tens of μm with the oscillation antinodes of the radiation to be emitted. Here, a laser diode with an $M^2=1$ in the plane of the drawing is assumed. Laser diodes which have a good beam quality at least in one direction offer an advantage since the interference pattern is then not "washed out", or is washed out less.

Figure 6:
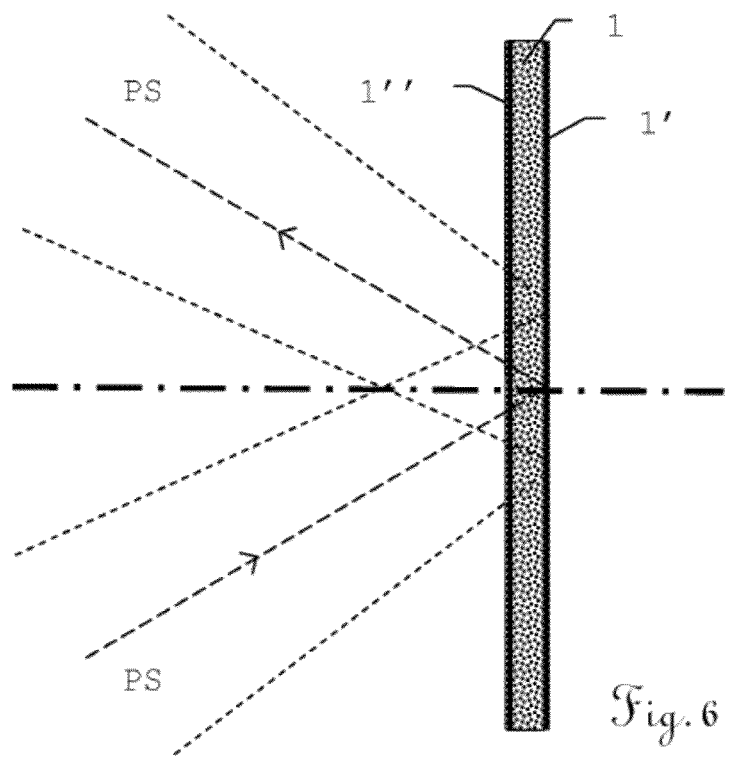
FIG. 6 shows the illustration of the pump method according to the invention for a laser medium between two reflective surfaces.

FIG. 6 again illustrates the pump method according to the invention for a laser medium 1 having two reflective surfaces (faces) 1' and 1". For the Nd:vanadate interfaces with air, there is a minimum internal incidence angle of about 28° at which TIR still prevails (n=2.16 with polarization parallel to the c axis). For GaAs against air, there is a minimum internal incidence angle of about 17° (respectively from the normal).

Figure 7:
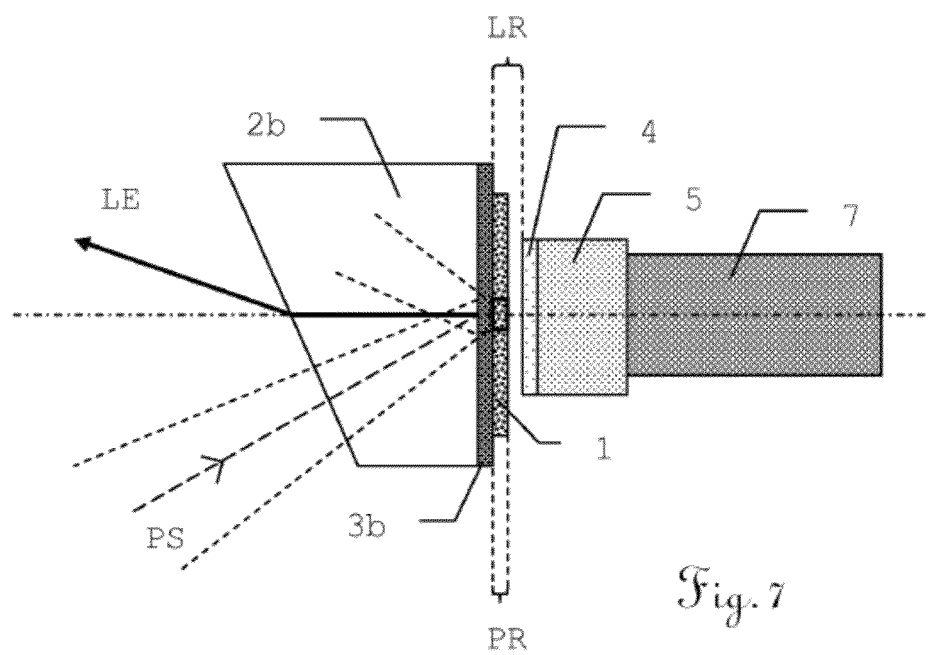
FIG. 7 shows the schematic representation of a fourth exemplary embodiment of the ultrashort pulse microchip laser according to the invention.

FIG. 7 shows the schematic representation of a fourth exemplary embodiment of the ultrashort pulse microchip laser according to the invention, in which the pump method according to the invention is used. In this exemplary embodiment, the substrate 2b has an entry window, inclined relative to the optical axis of the laser emission LE from the laser medium 1, for the pump radiation PS, so that the pump radiation PS is coupled into the ultrashort pulse microchip laser at a pump light incidence angle relative to the optical axis of the laser emission LE from the laser medium 1. In accordance with the already explained basic principle of the pump method according to the invention, the pump light incidence angle is selected in such a way that the distance between the pump radiation isophotes corresponds to the half-wave distance of the laser emission LE in the ultrashort pulse microchip laser. The pump radiation is in this case reflected back on the rear side of the laser medium by TIR. Since the pump radiation PS and the laser emission LE no longer have a common axis and are therefore separated in their beam path during the input and output coupling, a dichroic pump mirror can be obviated so that only a pure output coupling mirror is used as the first resonator mirror 3b, pump resonance being possible when the output coupling mirror is configured to be (partially) reflective for the pump wavelength, which increases the absorption and efficiency.

Figure 9:
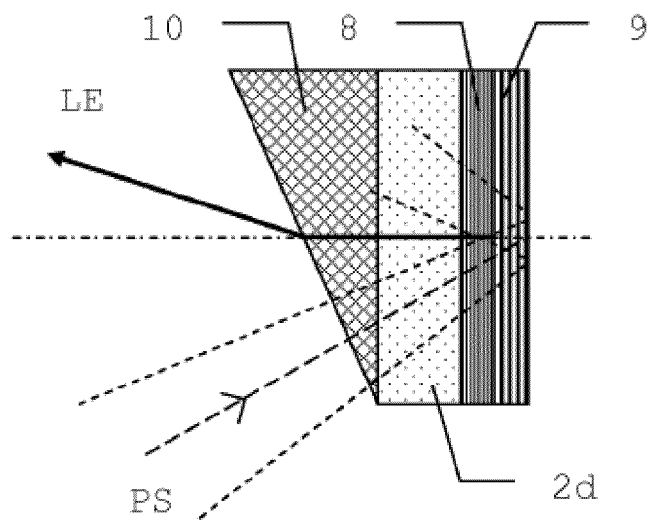
FIG. 9 shows the schematic representation of a sixth exemplary embodiment of the ultrashort pulse microchip laser according to the invention.

The inclined entry window may, as shown here, be formed by a wedge-shaped section of the substrate 2b or by the applied wedge-shaped component consisting of diamond or of substrate material, which is represented in FIG. 9. The wedge-shaped section of the substrate may in this case be produced by grinding or polishing down.

In order to permit tuning, or finely tuning adjustability, in this exemplary embodiment a SESAM is arranged as a saturable absorber structure 5 on a piezo element 7, so that the resonance condition for the laser wavelength can be adjusted toward the maximum of the gain curve of Nd:vanadate, 1064.3 nm. Owing to a certain distance between the laser medium and the saturable absorber structure 5, the evanescent wave of the pump radiation of the saturable absorber structure 5 has decayed, and further coating thereon for the purpose of reflecting the residual pump light is therefore no longer necessary in order to avoid presaturation of the by pump radiation PS.

As an alternative to the piezo element 7, however, a fixed spacer element may also be used, for example consisting of $SiO_2$ or a similar material, which is applied position-selectively by using a mask at the position at which the laser will subsequently be operated.

Owing to this structure, the pump resonance PR is defined by the thickness of the laser medium 1, while the length of the laser resonator LR is predetermined by the second resonator mirror.

Figure 8:
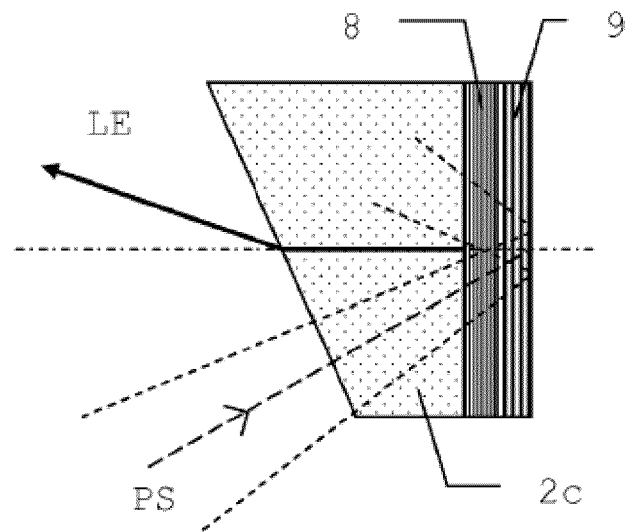
FIG. 8 shows the schematic representation of a fifth exemplary embodiment of the ultrashort pulse microchip laser according to the invention.

A fifth exemplary embodiment of the ultrashort pulse microchip laser according to the invention is represented in FIG. 8, the laser medium and the first resonator mirror being formed here in integrated form, on a GaAs substrate 2c polished on both sides, as a Bragg mirror 8 which is highly reflective for the laser emission LE and at least partially transmissive for the pump radiation PS and for the selected incidence angle, with grown quantum well structures 9 as laser medium, the quantum well structures 9 being arranged in the vicinity of pump radiation isophotes. In this case one or more quantum wells which exhibit emission at the desired wavelength, for example at 1064 nm, are grown onto the Bragg mirror 8. The pump radiation PS, for example with a wavelength of 980 nm, enters the substrate 2c from the rear side through an inclined entry window, or through a wedge face, and has its focus on the surface of the substrate 2c on which the Bragg mirror 8 and the quantum well structures 9 as amplification medium are arranged. By total reflection, the (residual) pump radiation is reflected back and generates, with the incident pump radiation PS, interference patterns consisting of isophotes as planes of maximum intensity, which extend parallel to the surface and therefore to the quantum well structures 9. The quantum well structures 9 are now positioned in such a way that they lie in the vicinity of these pump isophotes. Beforehand, the incidence angle of the pump radiation PS is established in such a way that the distance between the isophotes corresponds exactly to the half-wave distance of the laser radiation in the laser resonator. For an incidence angle of 22°, the optical spacing of the interference planes corresponds computationally to $$\Lambda = \frac{\lambda_{PS}}{2\cos\alpha} = \frac{980 \text{ nm}}{2\cos 22°} = 530 \text{ nm}.$$

Therefore, with a refractive index of 3.5 for GaAs, the physical spacing is 150 nm. For an incidence angle of 22°, there is TIR at the interface with air.

As an alternative to formation of the substrate 2c with a wedge, or an inclined entry face, or the application of a GaAs wedge for the purpose of input coupling, as shown in FIG. 9 for a sixth exemplary embodiment it is also possible to use a diamond wedge 10 which is applied on a flat GaAs substrate 2d and, besides the rear-side input coupling of the pump radiation, simultaneously also ensures good heat dissipation and heat distribution.

The second resonator mirror is not represented in FIGS. 8 and 9 for reasons of illustration, although it may be formed and arranged in a similar way to FIG. 7. It may therefore again be arranged at a distance from the first resonator mirror by means of gas or vacuum, or it may be bonded directly onto the active layers by means of low-index spacer layers of predetermined thickness, for example $SiO_2$ with a refractive index of n=1.4. It should be noted here that the minimum TIR angle will be greater when using spacer layers: for the transition from GaAs (n=3.5) to $SiO_2$ (n=1.4) it is about 24° from the normal, and for the transition from Nd:vanadate (n=2.16 parallel to c) to $SiO_2$ (n=1.4) it is then 40°. It should furthermore be noted that when using an $SiO_2$ spacer layer instead of air or vacuum, the evanescent wave decays less rapidly and this layer therefore needs to be made thicker.

Instead of the quantum well structures 9, however, it is also possible to use other semiconductor materials and structures; for example, so-called quantum dots or even unstructured semiconductor material may be used as the amplification medium. The layer structure of the integrated component will be explained in more detail in FIG. 9 with the aid of the tabulated representation of the layer sequences for the fifth and sixth exemplary embodiments.

In this example, an e.g. resonant quantum-well or quantum-dot absorber may undertake the function of the saturable absorber, so that picosecond laser pulses are formed with pulse lengths of less than 30 ps, less than 10 ps or even shorter than 1 ps.

Figures 10, 11:
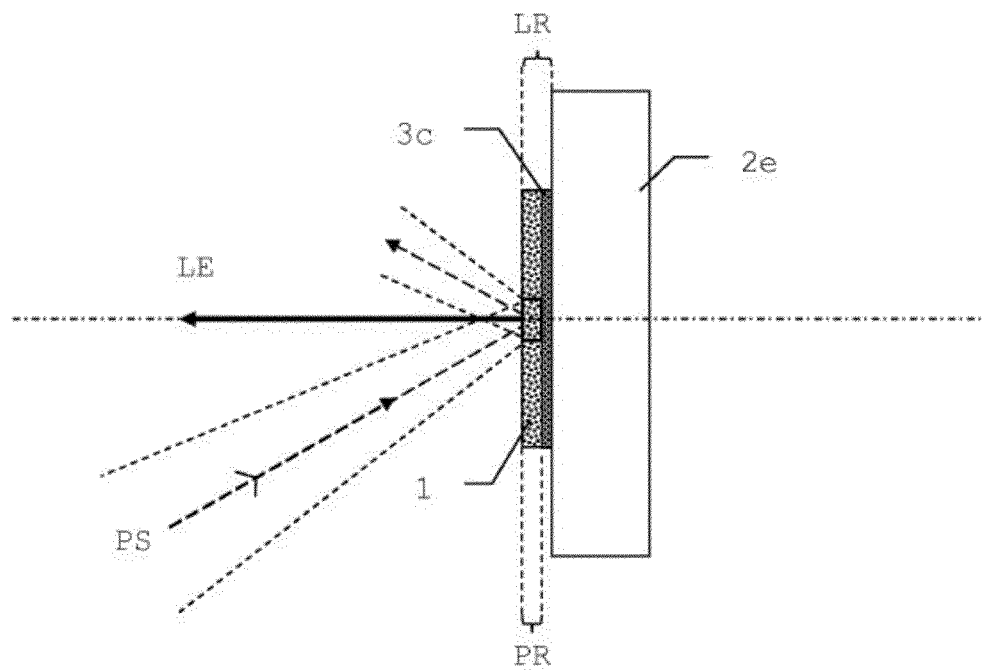
FIG. 10 shows the tabulated representation of the layer sequence for the fifth and sixth exemplary embodiments of the ultrashort pulse laser system according to the invention.
FIG. 11 shows the schematic representation of a seventh exemplary embodiment of the ultrashort pulse laser system according to the invention.

FIG. 10 shows the way in which a layer sequence of the semiconductor structure may specifically be configured, a reverse order being selected in this representation in comparison with FIGS. 8 and 9, i.e. air is on the top and the GaAs substrate is on the bottom. The quantum wells QW are adjusted accurately for the intended task in terms of their layer thicknesses and in terms of indium content, so that the photoluminescence or the emission has a maximum at 1064 nm, the heat formed during operation being taken into account. The layer thickness of the concluding layer B is adjusted in such a way that the pump radiation forms an intensity pattern overlapping with the quantum wells QW. SC in this FIG. 9 denotes a semiconductor layer and DBR ("distributed Bragg reflector") denotes the Bragg reflector. The number of repetitions of the respective layer sequences is indicated next to the table on the right, the Bragg reflector comprising for example a total of 25 GaAs/AlAs layer pairs.

If diamond is now arranged directly next to the active layer for the purpose of improved cooling, instead of the low-index spacer layer of $SiO_2$ or instead of air, gas or vacuum, then there is a minimum TIR incidence angle of about 44° between GaAs and diamond. The possible laser wavelength with optimal pump radiation and laser emission overlap is thereby shifted to values significantly greater than 1064 nm, i.e. an incidence angle of α=50° and a pump radiation wavelength of $\lambda_{PS}$=980 nm leads to a laser emission wavelength of $\lambda_{LE}$=1.5 µm.

FIG. 11 shows the schematic representation of a seventh exemplary embodiment of the ultrashort pulse laser system according to the invention. In this exemplary embodiment, the beam guiding for the pump radiation is carried out not through the substrate 2e but from the opposite side. The pump radiation PS enters the thin laser medium 1 of the laser arrangement at a pump light incidence angle relative to the optical axis of the laser emission LE. The unabsorbed part of the pump radiation PS is reflected by the first resonator mirror 3c lying on the rear side, i.e. between the thin laser medium 1 and the substrate 2e, so that an interference pattern, or a pump radiation isophote pattern, is formed. This first resonator mirror 3c is also highly or at least partially reflective for the laser emission wavelength. In accordance with the already explained basic principle of the pump method according to the invention, the pump light incidence angle is selected in such a way that the distance between the pump radiation isophotes corresponds to the half-wave distance of the laser emission LE in the thin laser medium 1. The pump radiation PS is in this case reflected back at the rear side of the laser medium 1 by reflection at the first resonator mirror 3c. Since the pump radiation PS and the laser emission LE no longer have a common axis and are therefore separated in their beam path during the input and output coupling, a dichroic pump mirror for the separation can be obviated.

Figure 12:
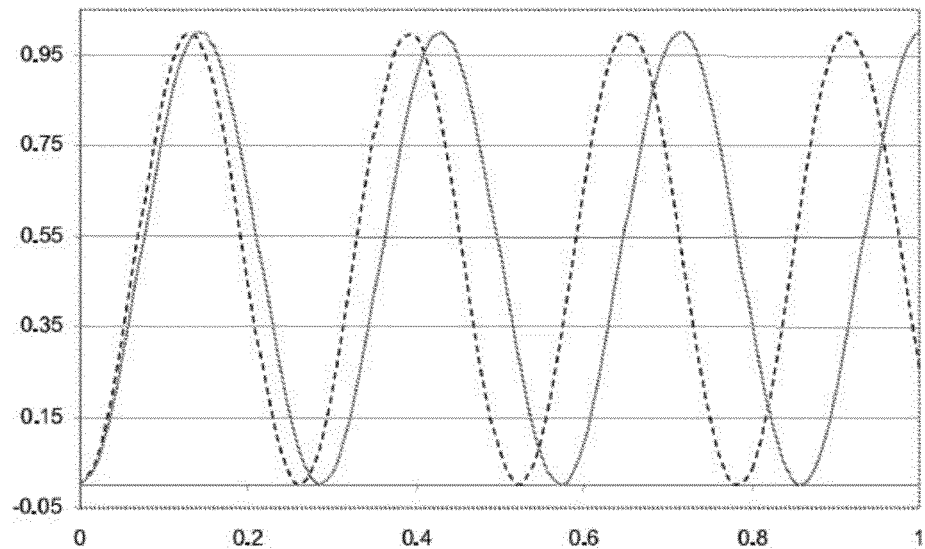
FIG. 12 shows the representation of the profile of the radiation fields of pump and laser radiation.
Figure 13:
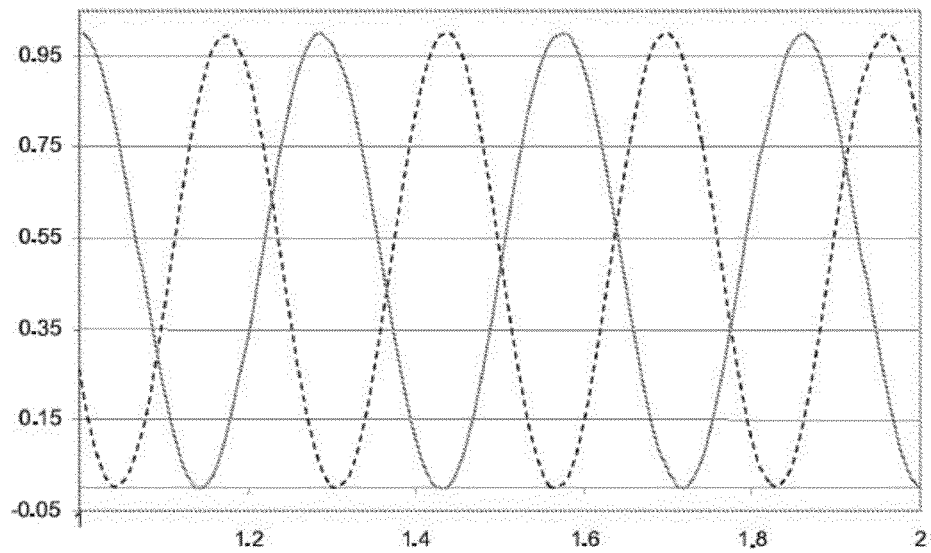
FIG. 13 shows the schematic representation of a seventh exemplary embodiment of the optimized pump arrangement according to the invention for thin laser media and FIGS. 14a-e show the schematic representations of exemplary embodiments of vertically emitting semiconductor lasers according to the invention.

The radiation fields of the pump and laser radiation are represented in FIG. 12 and FIG. 13 for the case of an incidence angle $\alpha=0°$ along the propagation axis in the example of a diode-pumped Yb:YAG laser, in both figures the physical length being represented horizontally as a propagation axis in μm and the radiation field being represented vertically respectively for the pump radiation (dashed line) and the laser emission (solid line). These are based on a pump wavelength of 940 nm, a laser operating wavelength of 1030 nm and a 50 μm thick laser medium. At the position zero, the two radiation fields are represented with the same phase, which may correspond to a predetermined position in the layer structure. Along the propagation axis z inside the laser medium, the two radiation fields then begin to divert rapidly so that the overlap, for example at the position z=1.5 μm is "out of phase" i.e. a pump radiation isophote meets a wave node of the laser emission radiation, which is illustrated in FIG. 13. According to the requirement $$\Lambda = \frac{\lambda}{2\cos\alpha}$$

with an internal pump incidence angle, i.e. taken inside the laser medium, of $\alpha=24.1°$, an overlap of the radiation fields obtained over the laser medium thickness of 50 μm is ensured, so that they do not diverge. This corresponds to an external pump radiation incidence angle of 47.3° from the normal, this being based on a refractive index of n=1.8 for Yb:YAG.

Furthermore, an arrangement for the purpose of pump resonance or pump intensity multiplication is possible when a (semi)reflective element is optionally applied on the front side of the thin laser medium, the phase of which element is selected in such a way that intensity multiplication takes place at the pump wavelength in the laser medium. This increases the effective pump absorption and the efficiency. Owing to this structure, the pump resonance is defined by the thickness of the laser medium, while the length of the laser resonator is predetermined by the second resonator mirror.

The substrate may consist of the same material type as the laser medium or may be formed from a material with better thermal conductivity than it, for example diamond. Active cooling of the rear side of the substrate, for example by means of water, leads to an arrangement which resembles a thin-disk laser structure but, according to the invention, has different guiding of the pump light at a determined incidence angle.

FIGS. 14a-e schematically represent exemplary embodiments of vertically emitting semiconductor lasers according to the invention, which use the pump method according to the invention by virtue of their structure. The exemplary embodiments presented below are Q-switched lasers, the laser resonator being configured as short as is technically possible so that a Q-switched pulse length in the range of 1 ps or even less can be formed owing to this short resonator length. It is therefore a vertically emitting (quantum well) optically pumped semiconductor laser—vertical cavity semiconductor laser (VCSEL) and therefore an optically pumped semiconductor laser (OPSL).

All the exemplary embodiments have in common a structure comprising a substrate 11, for example of GaAs, two resonator mirrors 12a and 12b, a saturable absorber structure 14, for example quantum dots, and an amplifying laser medium 15.

In contrast to similar arrangements of the prior art, the resonator is very short and is operated in a Q-switched rather than mode-coupled fashion.

This structure is based on a higher saturable absorption of the saturable absorber per resonator circuit being set up and the resonator being made as short as is possible, for example less than 50 optical half-wavelength thicknesses, or less than 150 μm, which corresponds to a circuit pulse repetition rate of more than 1 THz, so that the laser runs by itself in Q-switched operation. Such laser operation has the advantage that pulses with a higher energy and lower repetition rate are generated, so that some applications are better served and the pulses can more easily be separated by means of an electro/acousto-optical switch. In contrast to this, in the case of mode-coupled OPSLs, the repetition rate is usually in the GHz or multi-GHz range owing to the short resonator length, so that the pulse energy is lower (sub-nJ) and the spacing between the pulses is very short.

If the semiconductor laser structure is pumped in a pulsed fashion, then the thermal load is also less, which leads to great simplifications particularly in the OPSL case. In such arrangements, operation is otherwise often carried out with diamond, sometimes even with intracavity diamond, so that the achievable power increases greatly, but this is elaborate and expensive.

Pulsed pumping facilitates the cooling, so long as a pulse repetition rate reduced by means of this can be handled in the application although this represents no problem for example when using seed pulses. Then, owing to the short storage time—in the quantum well—of a few nanoseconds, the pump pulse may likewise last only a few nanoseconds. A substantial reduction of the heat introduced is then however already achievable when the pump pulse frequency lies in the range of a few tens of MHz and therefore in the range of commercially available mode-coupled lasers.

Figure 14A:
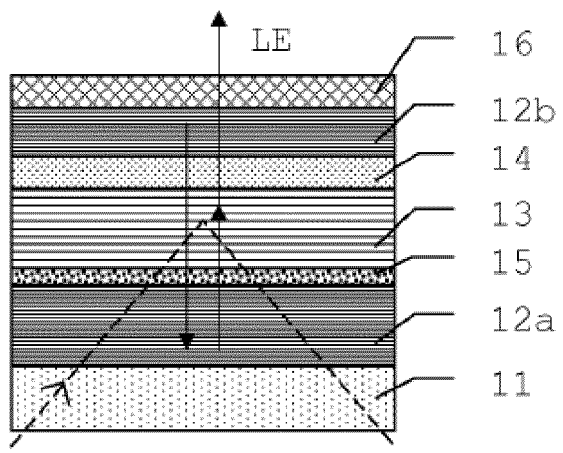

FIG. 14a now represents a first exemplary embodiment of a vertically emitting semiconductor laser according to the invention, in which the pump beam or the pump radiation PS enters the OPSL structure from the semiconductor substrate 11 through the first resonator mirror 12a. In view of the energetic conditions, the wavelength must lie above the bandgap of the substrate material. Depending on the desired (internal) angle, a chamfered entry window is advantageous or necessary, as represented in the preceding figures. The pump radiation PS is reflected at an epitaxially applied pump mirror 13. A polarization in the s direction (E field perpendicular to the plane of the drawing) may be advantageous, because the reflectivity in the pump mirror 13 configured as a Bragg mirror can be ensured with a smaller number of Bragg pairs than in the case of p-polarization. The effect of the resultant standing pump radiation PS in the amplifier section is that the amplifier medium 15, for example consisting of quantum wells or the like, is pumped, it being advantageous for the quantum wells to lie close to the pump isophote maxima. The pump radiation PS does not in this case go beyond the region of the pump mirror 13, so that the saturable absorber 14 placed there, preferably consisting of quantum dots, is not bleached out. The two resonator mirrors 12a and 12b form the cavity for the resulting laser emission LE; a part thereof can be coupled out. The phase of the resonator mirrors 12a and 12b, as well as of the pump mirror 13, and the position of the quantum wells as laser medium 15 and of the quantum dots as saturable absorber 14 should be matched to one another in such a way that the laser medium 15 and absorber 14 respectively lie close to or at a (local) field maximum, or in any event not directly at a field minimum, this applying in the case of the laser medium 15 simultaneously for pump radiation PS and laser emission LE.

Pulsed pumping can be particularly advantageous in this structure, so that the optional diamond piece 16 or other kind of highly thermally conductive, and optionally transparent, cooling material on the resonator mirror 12b can be obviated. The resonator mirror 12b may in this case also consist of conventional coating materials. All other layers or regions preferably consist of semiconductor materials such as GaAs, InGaAs, AlAs, AlGaAs or similar materials.

Figure 14B:
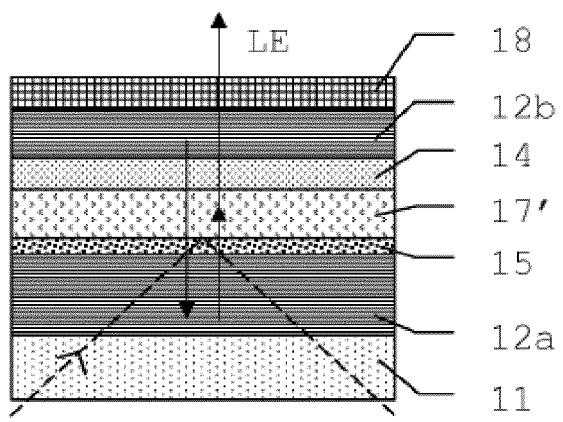

The second exemplary embodiment, shown in FIG. 14b, essentially corresponds to the first in structure, although in this case the pump radiation PS is reflected back by means of reflection at the surface of a spacer layer (spacer) 17' as a pump reflector and leads to utilization of the reflected pump radiation PS, and therefore increased efficiency. With a corresponding angle, this reflection may be brought about by means of total reflection (TIR) at the surface, or alternatively by means of a pump reflector which is applied in the form of a layer stack, in turn with semiconductor materials or with coated, vapor-deposited etc. dielectric layers. This pump reflector should be transmissive or partially transmissive for the laser radiation.

The spacer layer 17' may consist of air, gas, or of a dielectric material. In all these cases, that is to say including the case of dielectric material as the spacer layer 17', total reflection may be used as before as the mechanism for the pump reflector since the refractive index difference between GaAs and $SiO_2$ is still very high (3.5 compared with 1.46) and total reflection can therefore already take place at low incidence angles.

When using a dielectric spacer layer 17', it is possible to construct the entire structure monolithically. In the case of air or gas as the spacer layer 17', it is possible to continuously adjust one of the two halves of the overall structure precisely in position by means of a piezo element, so that the laser can be operated optimally, for example at the power maximum.

The second half of the laser consists of a SESAM semiconductor structure (Semiconductor Saturable Absorber Mirror) 14, quantum dots having saturable absorption at the wavelength of the laser emission LE being arranged at or in the vicinity of the oscillation antinode of the laser emission LE. A Bragg mirror, for example consisting of GaAs/AlGaAs, which has a number of Bragg pairs so that a part of the radiation leaves the laser, lies—as part of this saturable absorber 14—next to the resonator for the laser emission LE. In this case, the (pulsed) laser emission LE emerges through the GaAs substrate 18, which is preferably provided with an antireflection coating. The mode formation results from the refractive index profile owing to the resulting temperature distribution, but in this specific case additionally from the (positive) lenses which are obtained by the thermally induced curvature of the surfaces into the gas/air-filled volume of the spacer layer 17'.

Figure 14C:
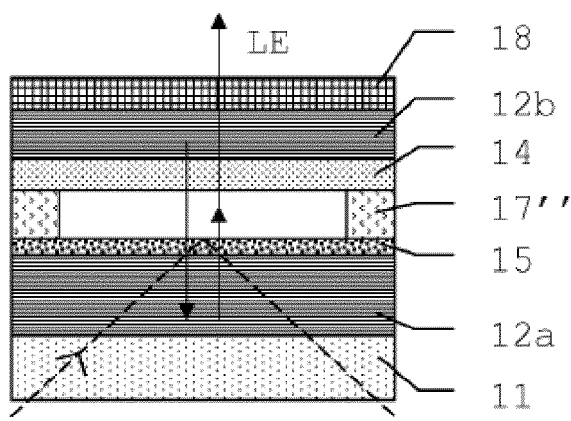

The structure represented in FIG. 14c is formed very similarly to the previous one, a material applied with particular thickness as a spacer layer 17" establishing a connection between the two halves separated by air or gas, and therefore mechanically connecting them and structurally assembling the overall structure to form a monolithic laser.

Figure 14D:
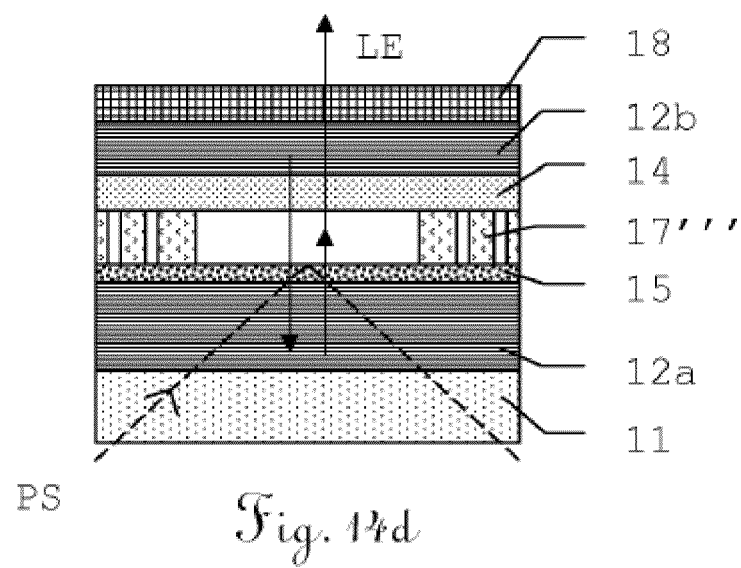

The arrangement shown in FIG. 14d also has a structure essentially similar to the preceding exemplary embodiments, the spacer layer 17''' in this case undertaking a mode-forming function and therefore consisting of transparent and structured dielectric material, for example $SiO_2$. The desired optical effect (for example focal length) can therefore be adjusted, in a very similar way to a Fresnel lens or zone plate. What is important, however, is then that the position of the pump radiation PS is matched to the position of this diffractive element and, for example, lies in the middle of this zone plate. The thickness and pattern of the segments of the spacer layer 17''' may advantageously be adjusted.

Figure 14E:
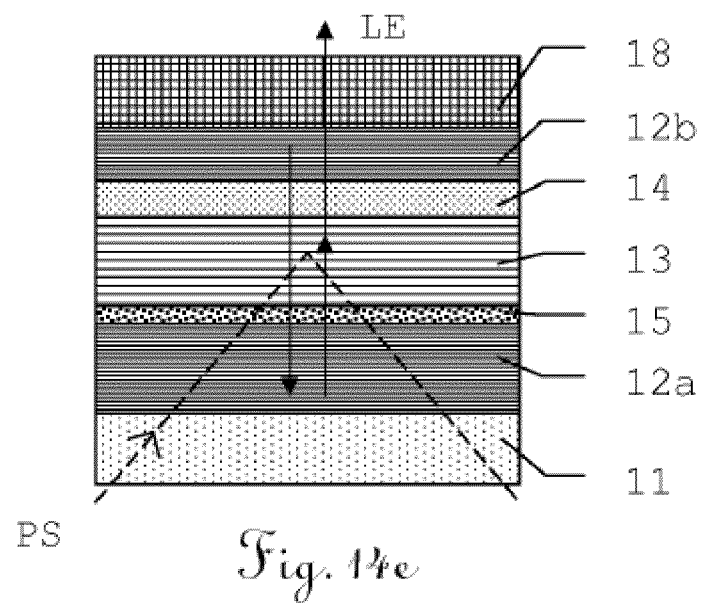

The exemplary embodiment of FIG. 14e involves a structure which is applied on a GaAs substrate 18 or other semiconductor substrate (from top to bottom): The resonator mirror 12b in the form of a Bragg mirror for the laser radiation, for example of 1064 nm, is applied thereon. Layers of quantum dots, which lie at the wave antinodes of the laser radiation which are reflected by the resonator mirror 12b, are applied on this Bragg mirror. A pump mirror 13, in turn consisting of epitaxial layers such as AlGaAs and AlAs, reflects the pump radiation PS and transmits a large part of the laser emission LE, so that the latter is not reflected until the resonator mirror 12b and experiences absorption in the quantum dots as saturable absorber 14. Lastly, on the pump mirror 13, as laser medium 15 there are the amplification layers in the form of quantum wells, likewise arranged at or in the vicinity of oscillation antinodes both of the pump radiation PS and of the laser emission LE. Lastly, the laser resonator is terminated by a dichroic pump mirror 12a as output coupler, consisting of semiconductor material or of conventional dielectric coating materials such as $SiO_2$, $Ta_2O_5$, $TiO_2$, which are applied by coating, sputter coating or vapor deposition. Transmission is in this case adjusted for the pump wavelength, and output coupling of the laser radiation can also be achieved by partial reflection of the laser emission LE.

This exemplary embodiment is shorter and therefore has shorter pulses than the preceding ones, because as one of the resonator mirrors 12a or 12b it is possible to use a conventional dielectric mirror which achieves higher reflectivity with a smaller penetration depth than a semiconductor Bragg mirror, so that a further saving can be made on the resonator length. Furthermore, cooling by means of optionally transparent heat sinks such as diamond is possible, which is less readily possible in the case of other arrangements having two GaAs substrates.

What is claimed is:

1. An optically pumped ultrashort pulse microchip laser for generating femto- or picosecond pulses:
   a substrate;
   an amplifying laser medium for generating the laser emission;
   a first resonator mirror which is at least partially transmissive for optical pump radiation;
   a component for generating laser emission (LE) with a femto- or picosecond pulse characteristic,
   wherein the substrate and the amplifying laser medium are made of the same material, and the laser medium has a thickness of less than 200 µm in direction of the laser emission and the substrate is doped at a lower degree with dopant material than the amplifying laser medium.

2. The ultrashort pulse microchip laser as claimed in claim 1, wherein the substrate consists of vanadate.

3. The ultrashort pulse microchip laser as claimed in claim 1, wherein the amplifying laser medium for generating the laser emission includes Nd:vanadate doped with more than 1% Nd.

4. The ultrashort pulse microchip laser as claimed in claim 1, wherein the component for generating laser emission with a femto- or picosecond pulse characteristic includes a saturable absorber structure.

5. The ultrashort pulse microchip laser as claimed in claim 1, wherein the laser medium has a thickness of less than 100 µm.

6. The ultrashort pulse microchip laser as claimed in claim 1, wherein the laser medium is a component whose original material thickness is reduced after bonding to the substrate.

7. The ultrashort pulse microchip laser as claimed in claim 6, wherein the laser medium is a component which is ground or polished down after bonding to the substrate.

8. The ultrashort pulse microchip laser as claimed in claim 1, wherein the substrate is undoped.

9. The ultrashort pulse microchip laser as claimed in claim 1, wherein a dichroic mirror is arranged as a second resonator mirror between the laser medium and a saturable absorber structure, which dichroic mirror is at least partially transmissive for the laser emission and is configured to be highly reflective for the pump radiation.

10. The ultrashort pulse microchip laser as claimed in claim 1, wherein the first resonator mirror is a dichroic output coupling mirror arranged between the substrate and the laser medium, which is configured to be at least partially transmissive for the laser emission and for the pump radiation.

11. The ultrashort pulse microchip laser as claimed in claim 10, wherein the dichroic output coupling mirror is partially reflective for the optical pump radiation and, together with:
   a second resonator mirror;
   a reflective interface of the laser medium; or
   total internal reflection in the laser medium;
is formed and arranged in such a way that:
   resonance for the laser emission; and
   intensity multiplication for the pump radiation take place.

12. The ultrashort pulse microchip laser as claimed in claim 10, wherein the dichroic output coupling mirror is partially reflective for the optical pump radiation and, together with:
   a second resonator mirror;
   a reflective interface of the laser medium; or
   total internal reflection in the laser medium;
is formed and arranged in such a way that:
   resonance for the laser emission; and
   intensity multiplication for the pump radiation take place, owing to a phase shift of zero between pump radiation isophotes and laser emission at the first resonator mirror.

13. The ultrashort pulse microchip laser as claimed in claim 1, wherein a resonator element is arranged on a piezo element.

14. The ultrashort pulse microchip laser as claimed in claim 1, wherein the component comprises a saturable absorber structure arranged on a piezo element.

15. The ultrashort pulse microchip laser as claimed in claim 1, wherein an entry window which is inclined relative to the optical axis of the laser emission from the laser medium.

16. The ultrashort pulse microchip laser as claimed in claim 15, wherein the inclined entry window is formed by a wedge-shaped section of the substrate or by an applied wedge-shaped component consisting of diamond or of substrate material.

17. The ultrashort pulse microchip laser as claimed in claim 1, wherein the laser medium and the first resonator mirror are formed on the substrate in integrated form as a Bragg mirror which is highly reflective for the laser emission and at least partially transmissive for the pump radiation, with grown quantum well structures as laser medium, the quantum well structures being arranged in the vicinity of pump radiation isophotes.

18. A laser system comprising an ultrashort pulse microchip laser as claimed in claim 1, wherein the pump radiation is coupled into the ultrashort pulse microchip laser at a pump radiation incidence angle relative to the optical axis of the laser emission from the laser medium.

19. The laser system as claimed in claim 18, wherein the pump radiation fall angle is selected in such a way that the distance between the pump radiation isophotes corresponds to the half-wave distance of the laser emission in the ultrashort pulse microchip laser.

20. A pump method for laser media having a thickness of less than 200 µm in direction of the laser emission for generating a laser emission with femto- or picosecond pulses, in an ultrashort pulse microchip laser as claimed in claim 1, comprising at least one coupling of optical pulsed pump radiation into the laser medium, wherein:
   the optical pump radiation is coupled into the laser medium in such a way that resonance for the laser emission and intensity multiplication for the pump radiation take place by the wavelength and incidence angle of the pump radiation being selected in such a way that the pump radiation isophotes correspond to an intensity pattern of the laser emission.

21. The pump method as claimed in claim 20, wherein there is a phase shift of zero between pump radiation isophotes and laser emission at a first resonator mirror which is at least partially transmissive for the pump radiation.

22. An optically pumped vertically emitting semiconductor laser for generating femto- or picosecond pulses with pulse durations of less than 30 ps, comprising:
   a substrate consisting of GaAs;
   a quantum well structure for generating the laser emission;
   a first resonator mirror which is at least partially transmissive for optical pulsed pump radiation;
   a second resonator mirror, the first and second resonator mirrors defining a resonator with a length of less than 150 µm;
   a pump mirror which is reflective for pump radiation or an optical surface totally reflecting the pump radiation;
   a saturable absorber structure for generating laser emission with a femto- or picosecond pulse characteristic, wherein:
   the first and second resonator mirrors;
   the pump mirror or the totally reflecting optical surface; and
   the laser medium;
are formed and arranged in such a way that:
   resonance for the laser emission; and
   intensity multiplication for the pump radiation take place by the wavelength and incidence angle of the pump radiation being selected in such a way that the pump radiation isophotes correspond to an intensity pattern of the laser emission.

23. The ultrashort pulse microchip laser as claimed in claim 1, wherein pulse durations are less than 30 ps.

24. The ultrashort pulse microchip laser as claimed in claim 1, wherein pulse durations are less than 10 ps.

25. The ultrashort pulse microchip laser as claimed in claim 1, wherein pulse durations are less than 1 ps.

26. The ultrashort pulse microchip laser as claimed in claim 1, wherein the component for generating laser emission (LE) is provided as a saturable absorber structure and arranged such that the ultrashort pulse microchip laser is Q-switched.

27. The optically pumped vertically emitting semiconductor laser as claimed in claim 22, wherein pulse durations are less than 10 ps.

28. The optically pumped vertically emitting semiconductor laser as claimed in claim 22, wherein pulse durations are less than 1 ps.

* * * * *